(12) United States Patent
Enzenroth et al.

(10) Patent No.: US 8,480,805 B2
(45) Date of Patent: Jul. 9, 2013

(54) SYSTEM AND METHOD FOR SEALING A VAPOR DEPOSITION SOURCE

(75) Inventors: Robert A. Enzenroth, Fort Collins, CO (US); Joseph D. LoBue, Dale, TX (US); Lawrence J. Knipp, Fort Collins, CO (US)

(73) Assignee: Colorado State University Research Foundation, Fort Collins, CO (US)

( * ) Notice: Subject to any disclaimer, the term of this patent is extended or adjusted under 35 U.S.C. 154(b) by 624 days.

(21) Appl. No.: 12/762,024

(22) Filed: Apr. 16, 2010

(65) Prior Publication Data

US 2011/0255950 A1    Oct. 20, 2011

(51) Int. Cl.
*C23C 16/00* (2006.01)
(52) U.S. Cl.
USPC ............................ 118/726; 118/733; 414/805
(58) Field of Classification Search
USPC ................... 118/726, 733; 414/805
See application file for complete search history.

(56) References Cited

U.S. PATENT DOCUMENTS 4,552,092 A * 11/1985 Yanagi et al. ............... 118/718

* cited by examiner

*Primary Examiner* — Jeffrie R Lund
*Assistant Examiner* — Satish Chandra

(57) ABSTRACT

A system and method for movably sealing a vapor deposition source is described. One embodiment includes a system for coating a substrate, the system comprising a deposition chamber; a vapor pocket located within the deposition chamber; and an at least one movable seal, wherein the at least one movable seal is configured to form a first seal with a first portion of a substrate, and wherein the first seal is configured to prevent a vapor from leaking past the first portion of the substrate out of the vapor pocket. In some embodiments, the movable seal may comprise a first flange, wherein the first flange forms a wall of the vapor pocket; and a second flange, wherein the second flange is configured to be movably disposed within a first groove of the source block.

12 Claims, 18 Drawing Sheets

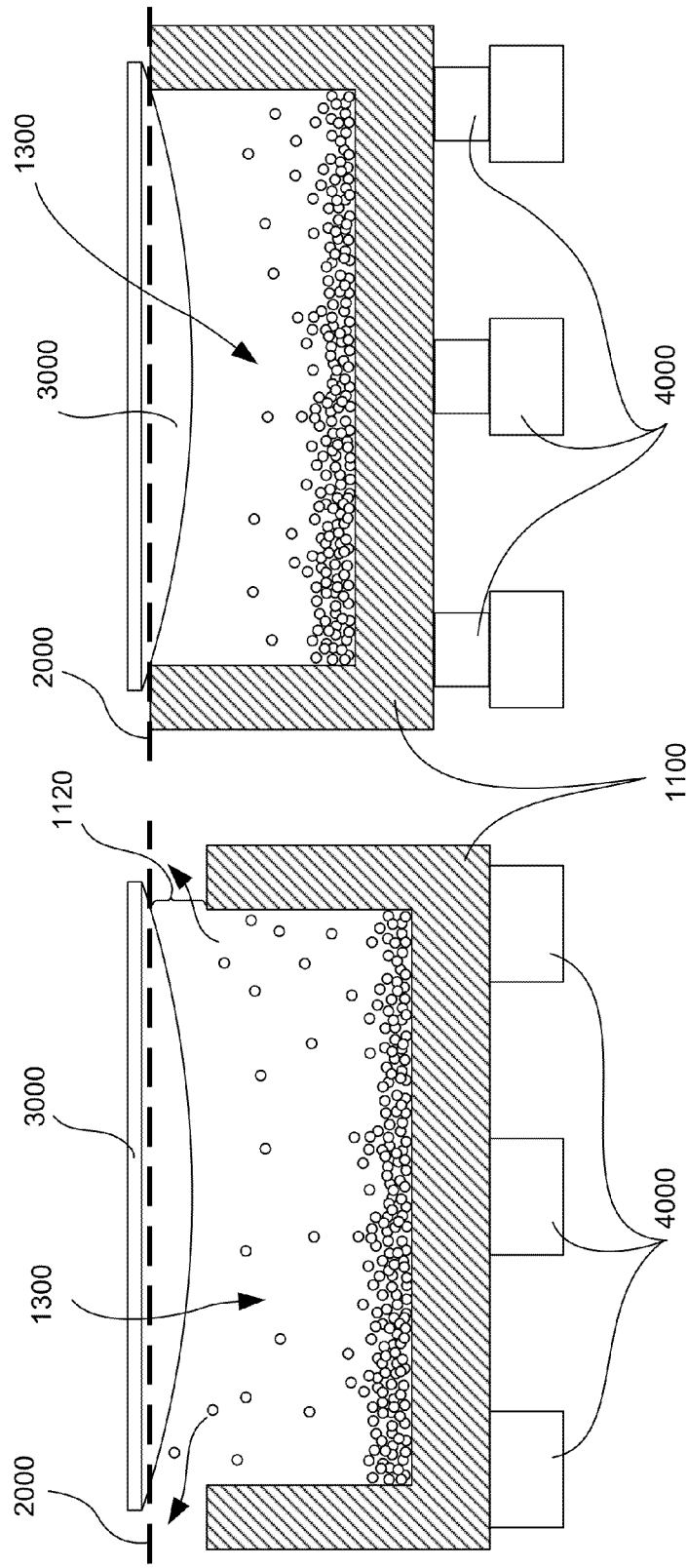

SYSTEM AND METHOD FOR SEALING A VAPOR DEPOSITION SOURCE

FIELD OF THE INVENTION

The present invention relates to systems and methods for depositing thin films on a substrate.

BACKGROUND OF THE INVENTION

The use of thin film coated substrates is ubiquitous in today's society. For example, thin film deposition is used for numerous aspects of consumer electronics (from integrated circuit fabrication to cell phone, computer and television display coatings), optics (e.g., coating glass), microparticle fabrication, photovoltaic fabrication, and packaging (e.g., aluminum coating on plastic for potato chip bags). In general, thin film deposition can be characterized as the deposition of a thin film, or thin layer, of material onto a substrate. Here substrate can refer to both the base material onto which the thin film is being deposited and any previously deposited layers. Thin film deposition can be split into chemical deposition and physical deposition processes.

Taking the production of solar modules or photovoltaic modules as an example, this is an area where the quality of the thin films and the expense and efficiency of producing the photovoltaic modules with the thin films are all significant in producing a commercially viable product. Numerous methods have been used for thin film deposition in photovoltaic module production, such as chemical vapor deposition (CVD) processes, including plasma-enhanced chemical vapor deposition (PECVD), and physical vapor deposition processes, including sputter deposition and evaporative deposition. While there has been significant development and improvement of thin film deposition processes for photovoltaic module production, any process can benefit from improved film uniformity, lower material waste and reduced downtime.

Taking one of these processes as an example, referring to FIG. 1 and FIG. 2 there are sectional views of an exemplary evaporative deposition system 1000 that could be used for thin film deposition during photovoltaic module production. This evaporative deposition system 1000 could be used for a closed space sublimation (CSS) or heated pocket deposition (HPD) process. The evaporative deposition system 1000 shown in FIG. 1 and FIG. 2 includes a source 1100 that contains a deposition material 1200. The source 1100 is disposed within a vacuum chamber (not shown). In FIG. 1, a substrate transport 2000 is shown which is configured to carry and position a substrate 3000 over the source 1100. FIG. 2, which is a sectional view orthogonal to that of FIG. 1, shows the substrate transport 2000 holding the sides of substrate 3000 carrying the substrate into (or out of) the paper.

In operation, the source 1100 is heated sufficiently such that the deposition material 1200 reaches a sublimation point. At the sublimation point, particles 1210 of the deposition material 1200 separate and enter a vapor pocket 1300. Optimally, the particles 1210, or vapor 1210, will travel through the vapor pocket 1300 and condense evenly across the surface of substrate 3000 forming a thin film. In order for this to occur, two conditions must occur (1) the energy of a particle 1210 must be low enough so that it does not continue to bounce off the substrate 3000; and (2) the surface temperature of the substrate 3000 must be low enough to absorb the latent heat within the particle 1210. However, numerous factors can negatively impact the quality of the thin film and the efficiency of the process.

For example, in current evaporative deposition systems 1000 the walls 1110 of the source 1100 are vertical. As a result (a) thermal energy radiated directly to the substrate 3000 heating the edges of the substrate 3000 near the walls 1110; and (b) a particle 1210 which impacted the vertical side wall would gain energy. These affects would make it less likely for a particle 1210 to deposit near the edges of the substrate 3000 resulting in the deposition of a non-uniform thin film.

In addition, it should be recognized that the substrate 3000 can deform under its own weight and/or bow due to thermal gradient through the thickness of the substrate 3000. Elevated temperatures in certain process conditions can further accentuate these problems. For purposes of illustration, this deformation is shown in exaggerated form in FIG. 1. Due to the deformation of the substrate 3000 there needs to be sufficient clearance between the substrate transport 2000 and the source 1100. However, this clearance creates a gap 1120 between the substrate 3000 and the source 1100 where particles 1210, or vapor 1210, can escape and deposit on other portions of the vacuum chamber (not shown). This causes multiple sources of inefficiency, such as material loss, increased costs for cleaning surfaces inside the vacuum chamber, and lost production time when the process is shutdown for cleaning.

Although present devices are functional, they are not sufficiently accurate or otherwise satisfactory. Accordingly, a system and method are needed to address the shortfalls of present technology and to provide other new and innovative features.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

The present invention can provide a system and method for movably seal a vapor pocket in a deposition chamber. In one exemplary embodiment, the present invention can include a system for coating a substrate, the system comprising a deposition chamber; a vapor pocket located within the deposition chamber; and an at least one movable seal, wherein the at least one movable seal is configured to form a first seal with a first portion of a substrate, and wherein the first seal is configured to prevent a vapor from leaking past the first portion of the substrate out of the vapor pocket. In some embodiments, the movable seal may comprise a first flange, wherein the first flange forms a wall of the vapor pocket; and a second flange, wherein the second flange is configured to be movably disposed within a first groove of the source block.

In another embodiment, the present invention can provide a system for coating a substrate, the system comprising a vapor pocket; a substrate; and an actuator, wherein the actuator is configured to movably seal the vapor pocket with the substrate to prevent a vapor from leaking past the substrate out of the vapor pocket. The system may further comprise a first movable insert, wherein the first movable insert is configured to be moved by the actuator to form a first seal with a first portion of the substrate.

In another embodiment, the present invention may provide a method for coating a substrate, the method comprising providing a substrate in a deposition chamber; positioning the substrate proximate to a vapor pocket, wherein positioning the substrate forms a gap where a vapor in the vapor pocket could leak past a first portion of the substrate; and movably sealing the gap. In one embodiment, movably sealing the gap may comprise moving a first insert, wherein the first insert contacts the first portion of the substrate. In various embodiments, the substrate may be positioned over a source block and the gap may be movably sealed by lowering the substrate, raising the source block, or some combination thereof.

In yet another embodiment, the present invention may comprise a perimeter mask for thin film deposition, the perimeter mask comprising an at least one mask surface, the at least one mask surface comprising a mask edge, wherein the mask edge is configured to be positioned proximate to a deposition surface; and wherein the at least one mask surface undercuts away from the mask edge. In various embodiments, the perimeter mask may comprise a bezel shape, a parabolic-curve shape, or a segmented curve shape. In some embodiments, the perimeter mask may partially surround a deposition source, such as a heated-pocket deposition source, a PECVD deposition source, or a sputter deposition source.

In yet another embodiment, the present invention may comprise a heated-pocket deposition source comprising a vapor source, wherein the vapor source is configured to heat a deposition material in order to form a deposition vapor; a vapor pocket connected to the vapor source; an aperture, wherein the aperture is configured to allow the deposition vapor to move from the vapor pocket and deposit on a substrate; and an aperture edge, wherein a portion of the aperture edge is formed by an undercut pocket wall.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawing wherein:

FIGS. 3A and 3B illustrates an embodiment of an evaporative deposition system with actuators for movably sealing the system.

DETAILED DESCRIPTION

Figure 1:
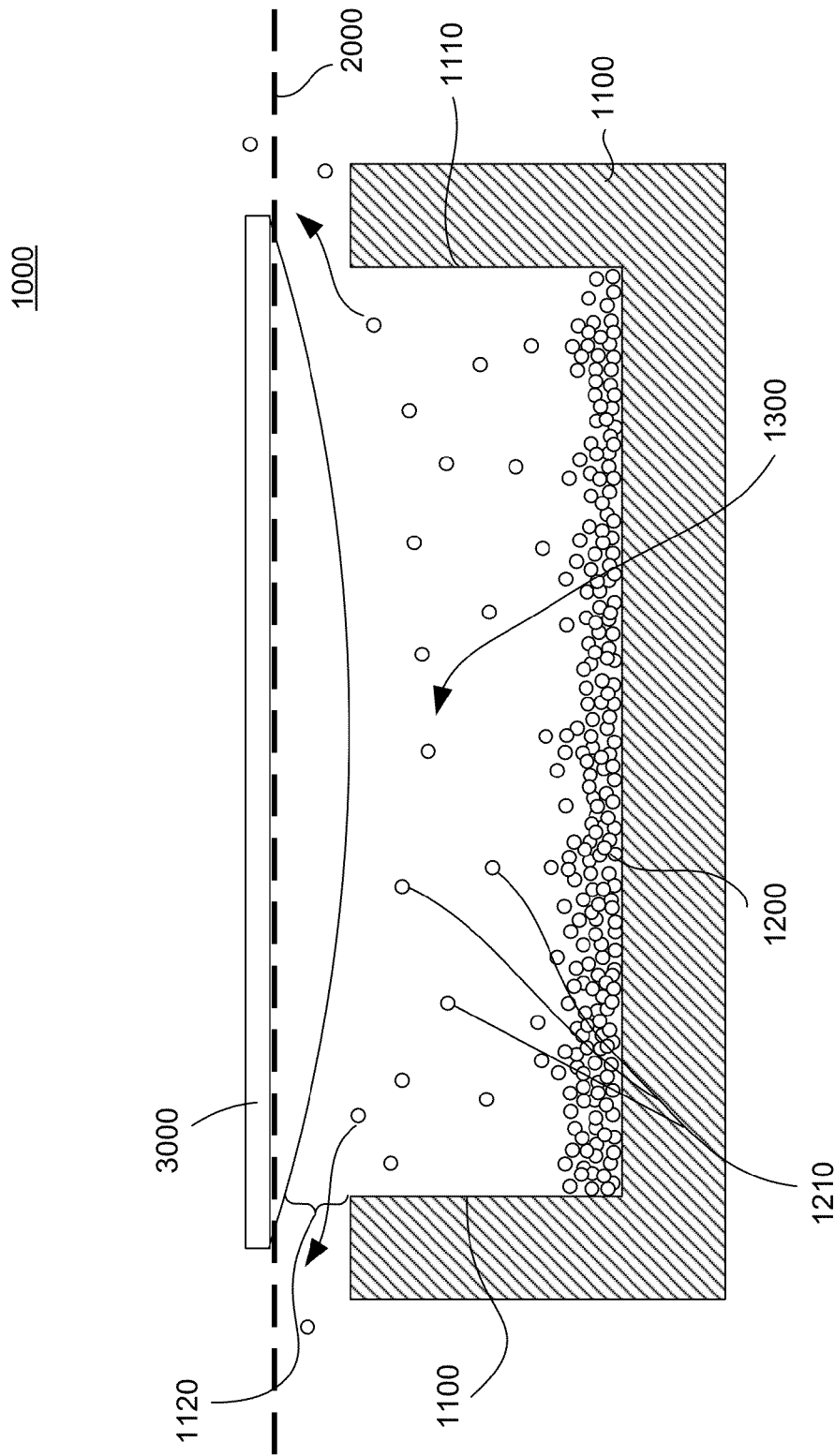
FIG. 1 illustrates a sectional view of typical prior art evaporative deposition system.
Figure 2:
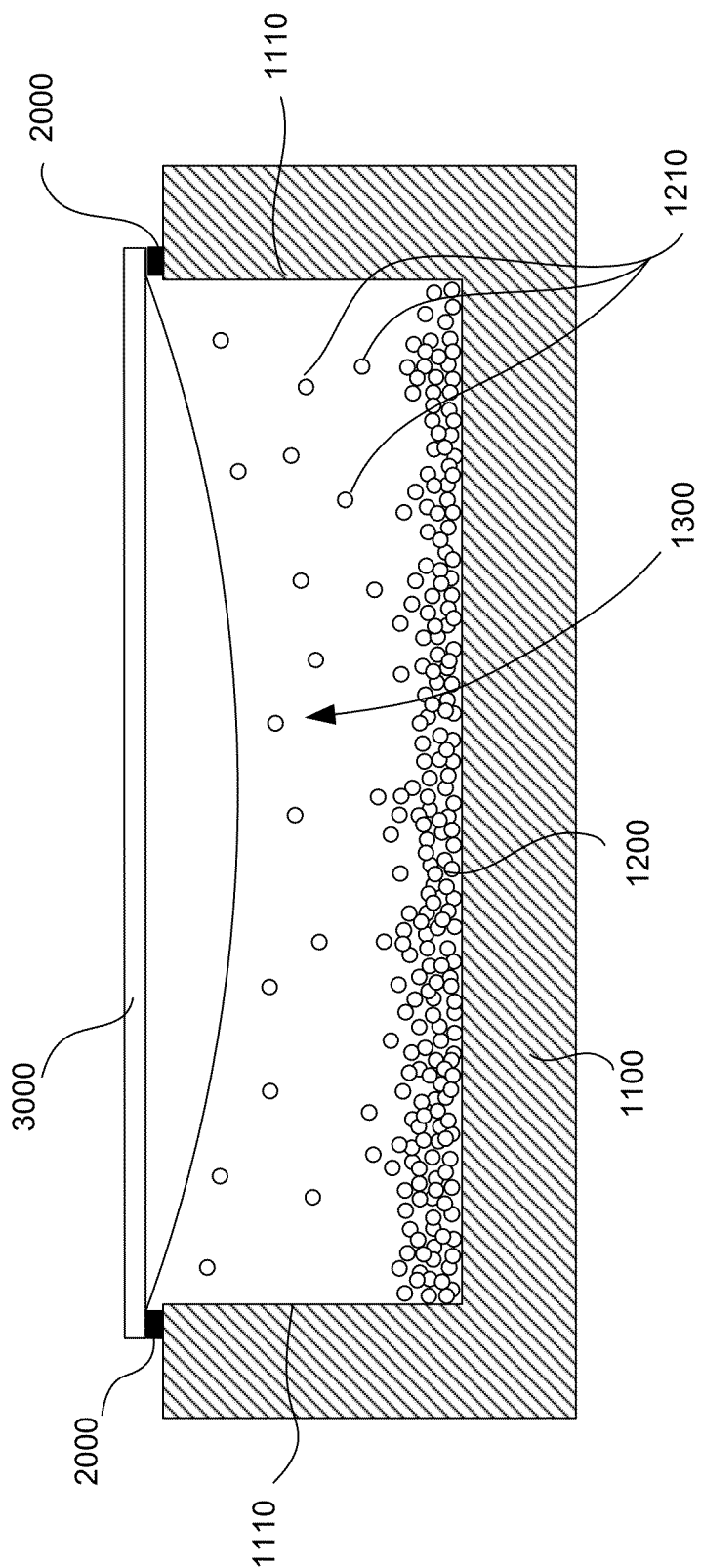
FIG. 2 illustrates an orthogonal sectional view of the evaporative deposition system in FIG. 1.

Referring now to the drawings, where like or similar elements are designated with identical reference numerals throughout the several views, and referring in particular to FIG. 3, it illustrates a cross section of an evaporative deposition system 1000 consistent with an embodiment of the present invention. As shown in FIG. 3, the evaporative deposition system 1000 comprises a source 1100, a substrate transport 2000 for moving and positioning a substrate 3000 over a vapor pocket 1300, and an actuator 4000 for movably sealing the vapor pocket 1300. In FIG. 3 the source 1100 is a box or cuboid configured to hold and heat a deposition material 1200. The source 1100 forms a vapor pocket 1300 with the substrate 3000 where particles 1210, or a vapor 1210, from the deposition material 1200 escape during sublimation and can condense on the substrate 3000 to form a film. The source 1100 in FIG. 3 is exemplary only and those of skill in the art will readily be aware of alternative shapes and designs that could be used consistent with the present invention. For example, in an alternative embodiment the source 1100 could have separate chambers or pockets in its base for storing and heating the deposition material 1200 (rather than having a flat base as shown in FIG. 3).

The actuator 4000 in FIG. 3 is configured to raise or lower the source 1100. For example, in FIG. 3A, the actuator 4000 is in an open, or lowered, position in order to allow the substrate transport 2000 to carry the substrate 3000 over the vapor pocket 1300 while allowing clearance for the substrate 3000, including any deformation of the substrate 3000. As shown in FIG. 3B, once the substrate is in position over the vapor pocket 1300 the actuator 4000 can movably seal the vapor pocket 1300 by raising the source 1100 so that the top of the walls of the source 1100 are proximate to, up to and including contacting, the substrate 3000. It is not required that the walls 1110 of the source 1100 necessarily contact the substrate 3000 in order to seal the vapor pocket 1300. Instead, the actuator 4000 movably seals the vapor pocket 1300 by moving the source 1100 sufficiently proximate to the substrate 3000 in order to prevent particles 1210 from escaping between the substrate 3000 and the source 1100.

While the substrate 3000 is in a horizontal position in FIG. 3, nothing in the present invention limits the application of this invention to such an embodiment. Those of ordinary skill in the art will understand how to modify and adapt the present invention to other substrate 3000 and source 1100 configurations.

In some embodiments of the present invention, an insulator (not shown) can be used between the source 1100 and the substrate 3000. The source 1100 is typically maintained at an elevated temperate, commonly ranging from 200-700° C., in order to heat the deposition material 1200. Moreover, the walls of the source 1100 are also maintained at an elevated temperature in order to prevent deposition on the walls. Because the substrate 3000 must be maintained at a lower temperature to promote particle 1210 condensation on the substrate 3000, it can be beneficial to reduce thermal transfer between the substrate 3000 and the source 1100. Reducing thermal transfer between the substrate 3000 and the source 1100 promotes film growth uniformity by reducing temperature differences across the substrate 3000. Moreover, in some embodiments the material composition of the substrate 3000 may require insulation to prevent a high temperature source 1100 from negatively impacting the substrate structure due to contact. An insulator (not shown) could be used to accomplish these and other functions.

In some embodiments, such as is shown in FIG. 3, the actuator 4000 could comprise hydraulic lifts configured to raise and lower the source 1100. In another embodiment, an actuator can be configured to raise and lower a substrate transport 2000 for transport and sealing. Numerous options exist depending on the type of substrate transport being used. For example, in one embodiment the substrate transport 2000 may comprise a track system with belts which guide the substrate 3000 through the device. These belts may be supported on rails that can be raised and lowered for transport and sealing. Those of skill in the art will be readily aware of alternative design options. It may be necessary or beneficial to use an insulator (not shown) between the source 1100 and the actuator 4000.

Figure 4A:
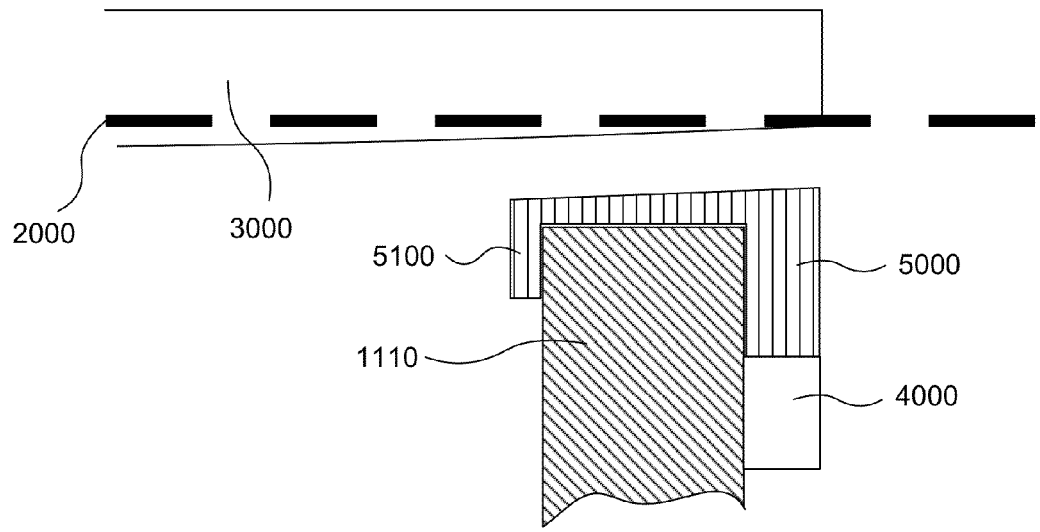
FIG. 4 illustrates an embodiment of a movable insert that can be used to form a seal with a portion of a substrate.
Figure 4B:
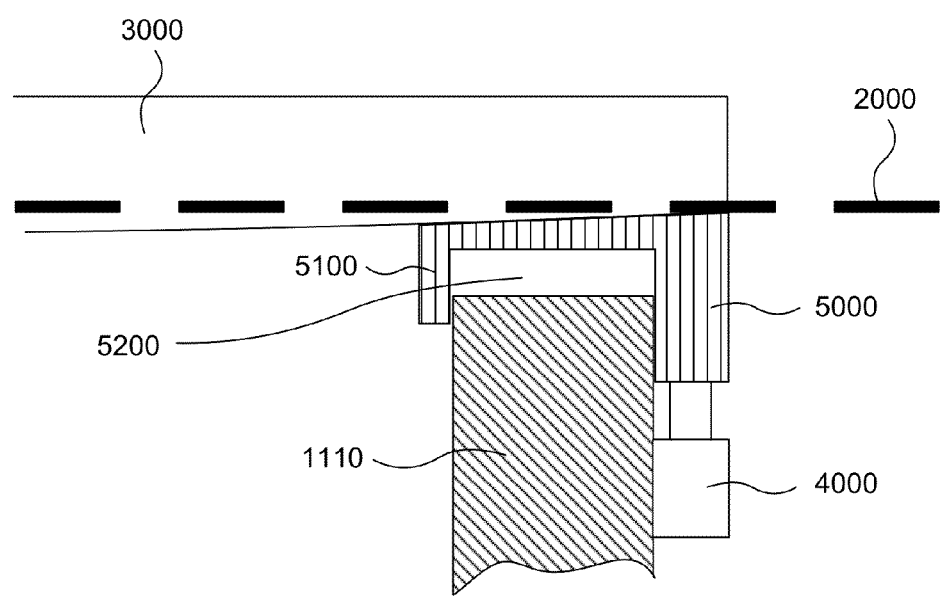

FIG. 4 shows another embodiment of the present invention, wherein a movable seal or movable insert 5000 is configured to form a seal with the substrate 3000. Given the weight of the source 1100, it may be preferred in some instances to move a relatively small insert 5000 rather than the entire source 1100. It is noted that it in some embodiments it may be preferred to use both an actuator 4000 to move the source 1100 and the movable inserts 5000 described here to seal against the substrate 3000. It is also noted that in some embodiments the substrate transport 2000 can be configured to move the substrate 3000 in order to form the seal with the source 1100.

The actuator 4000 in FIG. 4 can be used lower (open) or raise (close) the movable insert 5000. The movable insert 5000 in FIG. 4 comprises a flange 5100 used to block particles from entering the open space 5200 formed between the movable insert 5000 and the source 1100 when the movable insert 5000 is in a closed (or sealed) position. The actuator 4000 may be attached to, or separated from the source 1100. Depending on the construction of the actuator 4000, thermal concerns may encourage the use of insulation between the source 1100 and the actuator 4000.

The view shown in FIG. 4 is a sectional view of the movable insert 5000. In one embodiment, the movable insert 5000 could extend the width of substrate 3000 between the portions of the substrate transport 2000 which are holding the substrate 3000. In another embodiment, multiple movable inserts 5000 could be used to extend along that length. The movable insert 5000 forms a seal with a portion of the substrate 3000 and prevents particles from escaping past that portion. In order to prevent any particles or vapor from escaping the vapor pocket 1300 the perimeter of the substrate 3000 must be sealed. Taking a rectangular substrate as an example, movable inserts 5000 can be used to seal one side or multiple sides of the rectangular substrate. In one embodiment, the substrate transport 2000 can be configured to fit against, or form a seal with, the source 1100 on two sides of the rectangular substrate. If the rectangular substrate were deformed, the deformation will be more pronounced closer to the middle of the rectangular substrate than the edges. Movable inserts 5000 on the remaining two sides of the vapor pocket 1300 could be configured to lower sufficiently to allow the substrate 3000 to move over the vapor pocket 1300 and then rise in order to form a seal with the remaining two edges of the rectangular substrate, forming a seal around the vapor pocket 1300.

A movable insert 5000 may also be configured such that the shape of the upper surface of the movable insert 5000, where the movable insert 5000 forms a seal with the substrate 3000, more closely matches the shape of the substrate 3000. For example, if the portion of the substrate 3000 that forms the seal with the movable insert 5000 is non-linear, such as because of deformation due to process conditions or because the substrate is intentionally non-linear, the movable insert 5000 can be configured to more closely match against that shape.

Figure 5:
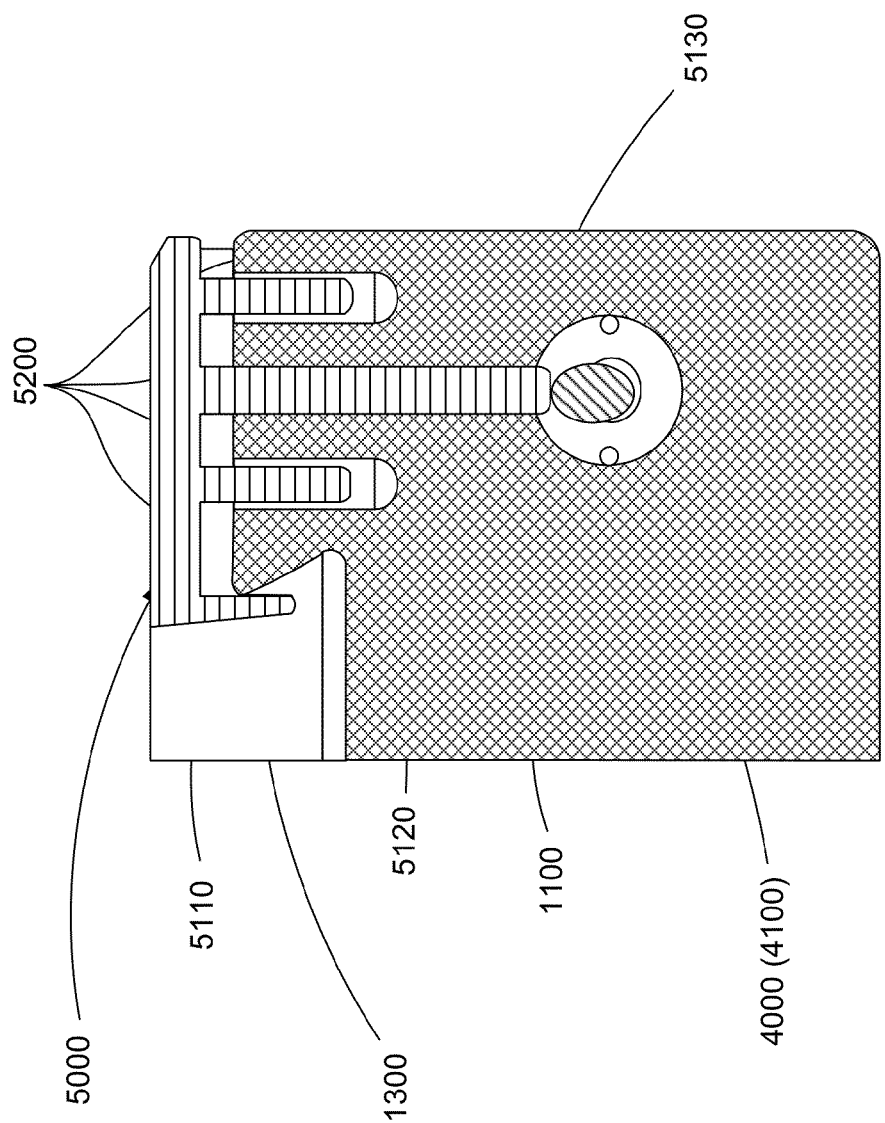
FIG. 5 illustrates an embodiment of a movable insert that can be used to form a seal with a portion of a substrate.

In order to prevent deposition on the movable insert 5000 it may also be configured to promote thermal transfer from the source 1100. For example, the design and material properties (including the composition of the material and the directional thermal transfer properties of the material) of the movable insert 5000 can all be adapted to promote thermal transfer. FIG. 5 shows one embodiment of a movable insert 5000 and actuator 4000 design to promote thermal transfer between the source 1100 and the movable insert 5000.

As shown in FIG. 5 the movable insert 5000 may include multiple flanges 5110, 5120, 5130, 5140. In this case, a first flange 5110 is used as discussed above to help create a barrier between the vapor pocket 1300 and the open space or gaps 5200 formed between the movable insert 5000 and the source 1100. Guide flanges 5120, 5130, 5140 are used to help guide movement of the movable insert 5000 and to increase surface area for thermal transfer between the source 1100 and the movable insert 5000. In the embodiment in FIG. 5, one of the guide flanges 5130 is configured to rest against an actuator 4000, here an actuator cam 4100, for opening and closing the movable insert 5000.

A movable insert 5000 may be comprised of a material that both promotes heat transfer and minimizes thermal expansion. For example, for the embodiment discussed relative to FIG. 5 the flanges 5100 of the movable insert 5000 must be configured to fit closely with source 1100 in order to promote heat transfer and prevent particles from entering between gaps. But the flanges 5100 must also have sufficient tolerance that any expansion due to elevated temperatures will not cause the flanges 5100 of movable insert 5000 to become lodged in the source 1100. Possible materials include graphite, extruded graphite, isomolded graphite, titanium, thermally conductive ceramics and tungsten. Design considerations, operational conditions and cost are all important factors as those skilled in the art select a proper material.

The actuator cam 4100 in FIG. 5 is configured such that it can raise or lower the movable insert 5000 through rotation. In this embodiment, the actuator cam 4100 is disposed within a conduit 1130 in source 1100. The size of the conduit 1130 may be selected to help reduce thermal transfer between the source 1100 and the actuator cam 4100. In addition, the material selected for the actuator cam 4100 should be able to withstand repeated operations and operate under the thermal conditions. For example, stainless steels or ceramics may be potential materials for the cam 4100.

Figure 6:
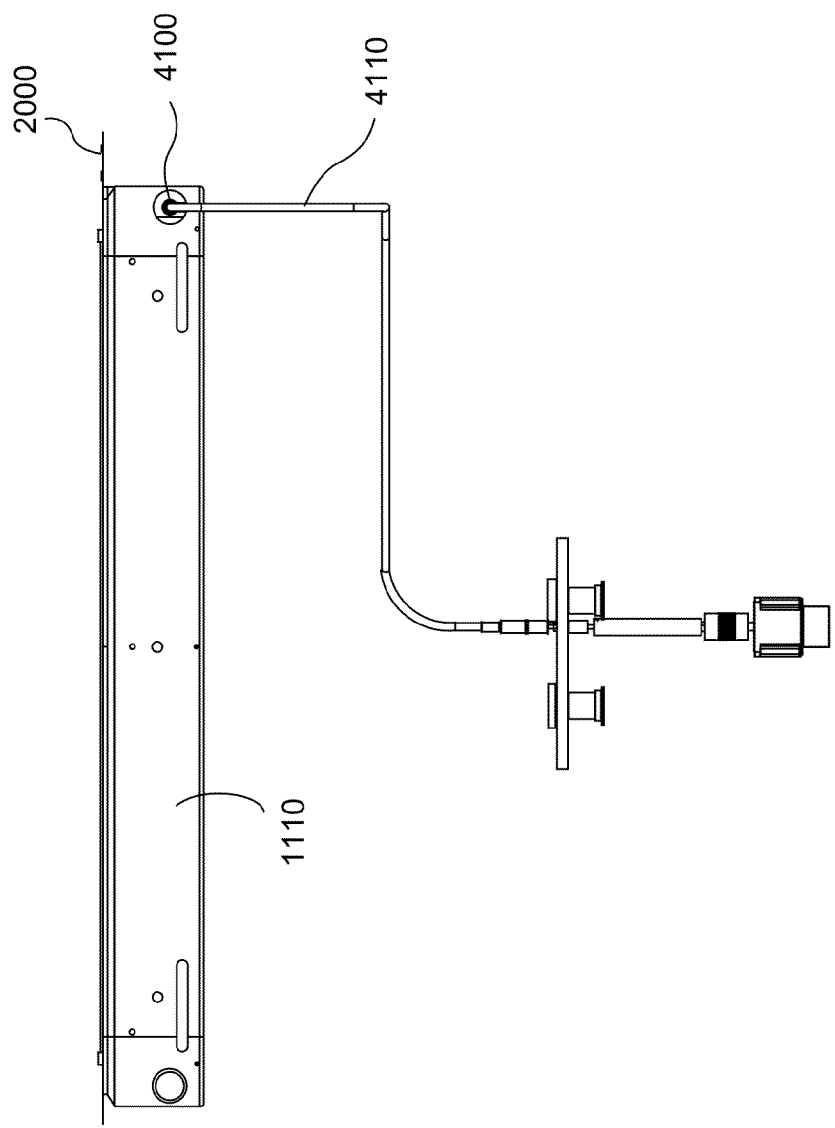
FIG. 6 illustrates an exterior side view of an evaporative deposition system that can be used consistent with the present invention.
Figure 7:
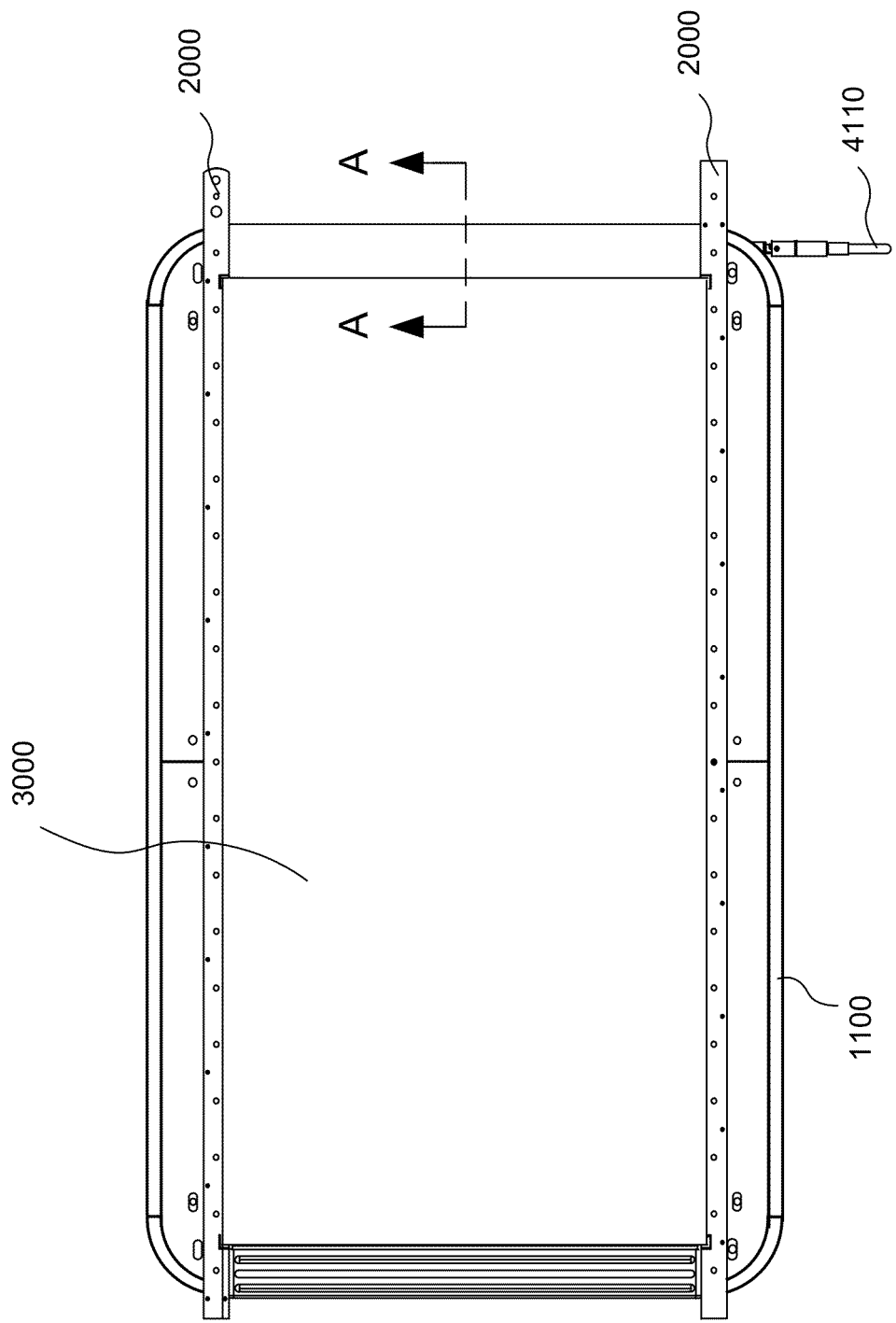
FIG. 7 illustrates an exterior top view of an evaporative deposition system that can be used consistent with the present invention.
Figure 8:
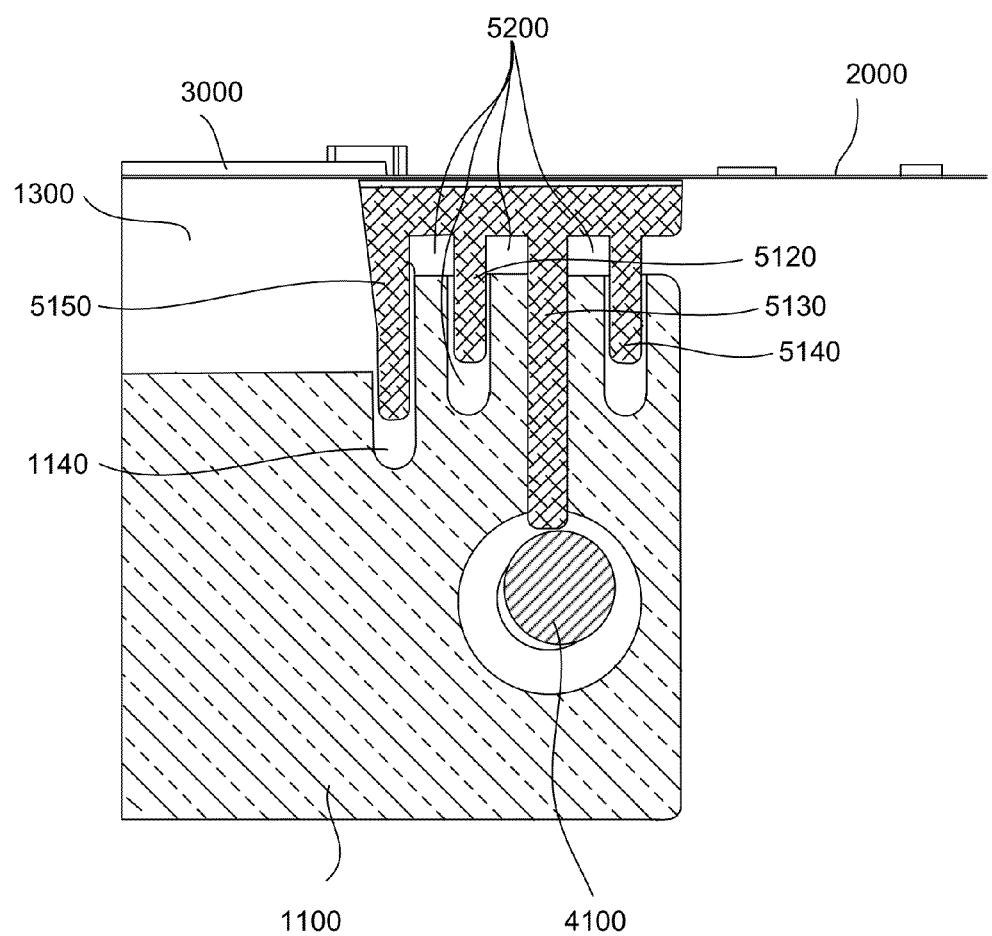
FIG. 8 illustrates a sectional view of the evaporative deposition system in FIGS. 6-7 that can be used consistent with the present invention.

Now referring to FIGS. 6-8 there is an embodiment of an evaporative deposition system 1000 consistent with the present invention. FIGS. 6-7 show an exterior view of the evaporative deposition system 1000 with source 1100, substrate transport 2000, and the rotary flex cable 4110 for the actuator cam 4100. One advantage of the actuator cam 4100 is that it allows for a thin rotary flex cable 4110 to be used. Given the complexity of deposition systems, and the operation conditions, it is advantageous to be able to minimize the size and number of parts that need to be close to the source 1100.

The top view in FIG. 7 is shown looking down on substrate 3000, substrate transport 2000, source 1100, rotary flex cable 4110, and movable insert 5000. Sectional view A-A, shown in FIG. 8 depicts an embodiment of a movable insert 5000 consistent with the present invention. In this embodiment an undercut flange 5150 serves as a wall for vapor pocket 1300. As shown, the undercut flange 5150 is undercut—that is, the surface of the undercut flange 5150 which faces the vapor pocket slants away from where the movable insert 5000 forms a seal with substrate 3000. The benefits of an undercut design are discussed in greater detail below. In addition to being undercut, the undercut flange 5150 is also configured such that it extends into a pocket 1140 of source 1100. Extending the length of the innermost flange—here undercut flange 5150—protects against any deposition material getting into gaps 5200 between movable insert 5000 and source 1100. As shown in FIG. 8 the undercut flange 5150 has sufficient length that when the movable insert 5000 is in a raised or sealed position the undercut flange 5150 still protrudes into the source 1100.

Figure 9A:
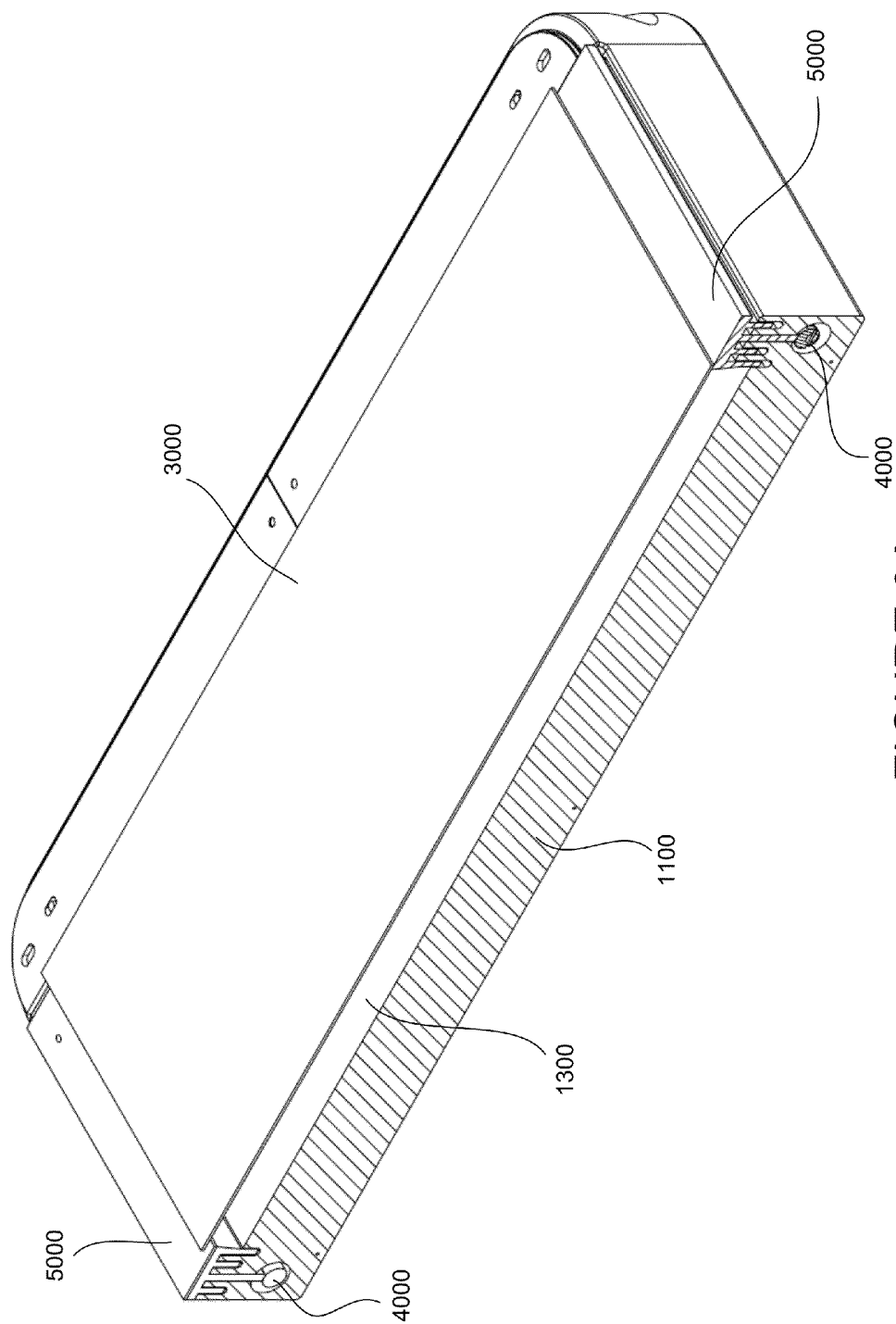
FIG. 9A illustrates an isometric view of an evaporative deposition system that can be used consistent with the present invention.
Figure 9B:
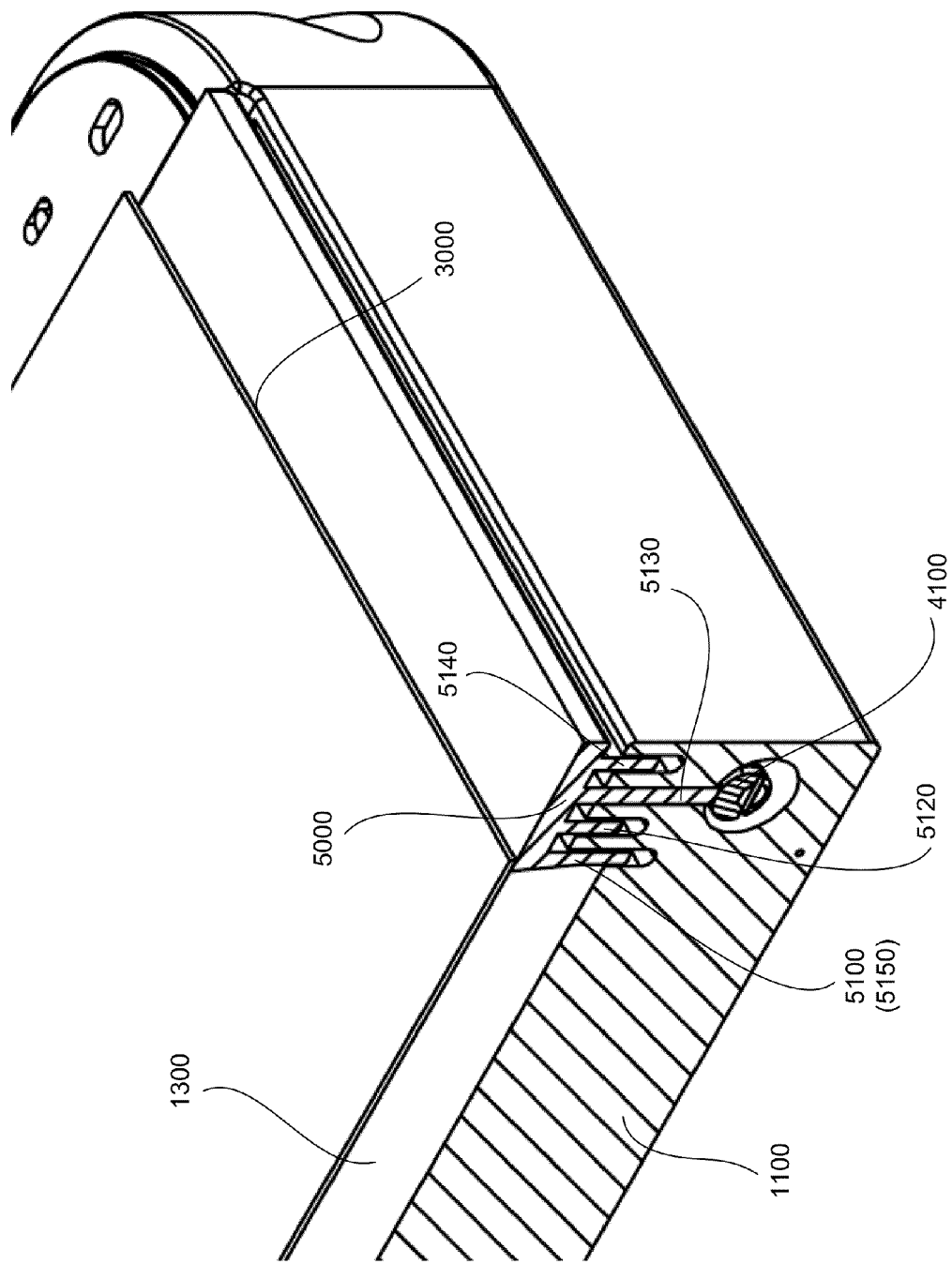
FIG. 9B illustrates an enlarged view of one end of the evaporative deposition system in FIG. 9A.
Figure 10:
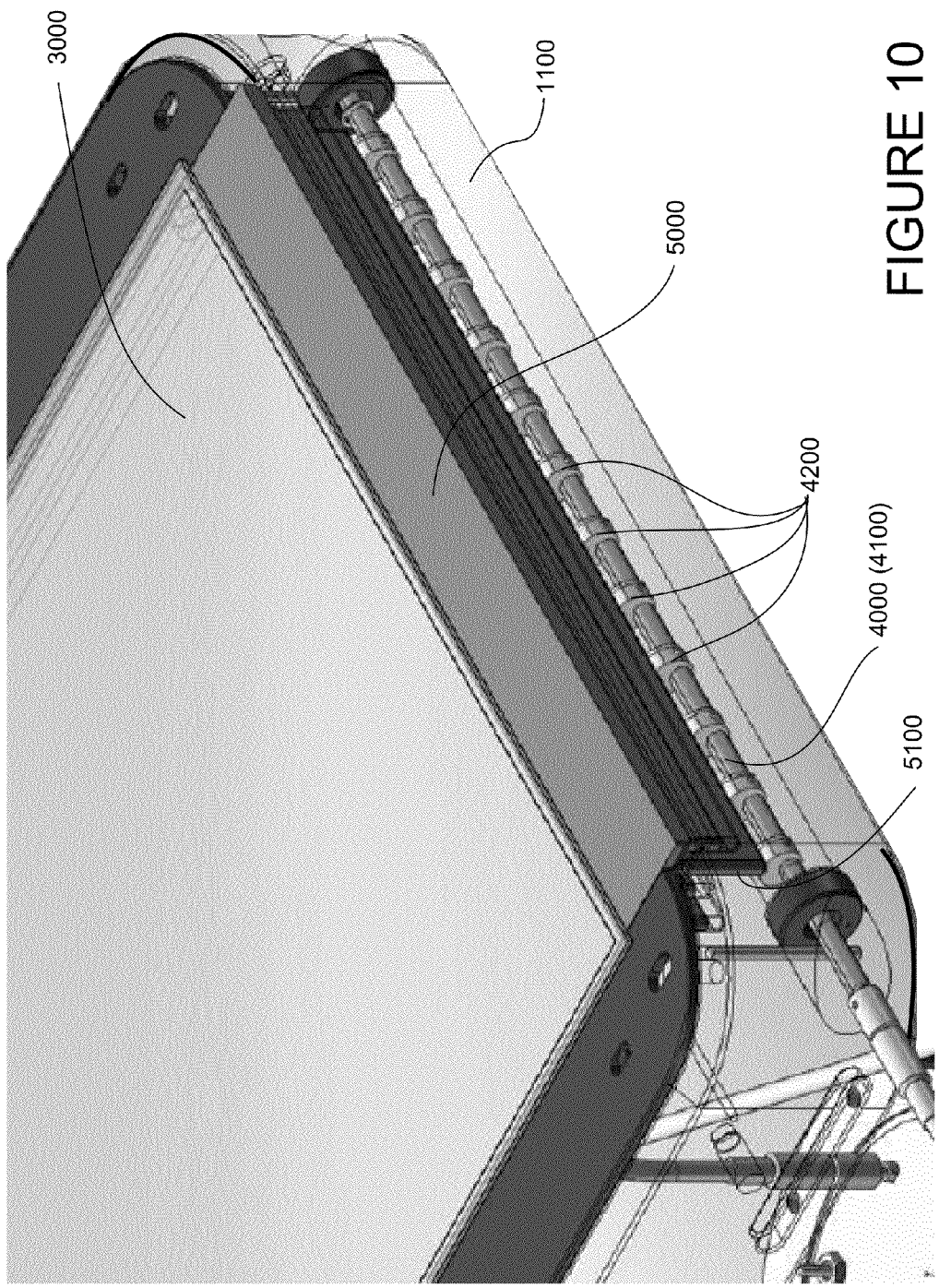
FIG. 10 illustrates an isometric view of an evaporative deposition system that can be used consistent with the present invention.

FIGS. 9A, 9B and 10 show further isometric views of an embodiment consistent with the present invention. Referring first to FIG. 9A, it shows a cut way view of an exemplary evaporative deposition system 1000. In this example, two movable inserts 5000 are used at each end of the source 1100 in order to form seals with substrate 3000. FIG. 9B shows an enlarged view of one movable insert 5000. As shown, the movable insert 5000 has four flanges 5110, 5120, 5130, 5140 for promoting heat transfer, guiding motion, and protecting against deposition material getting into gaps between the movable insert 5000 and source 1100.

FIG. 10 further displays the actuator 4000 used for lowering and raising the movable insert 5000. As shown, the embodiment in FIG. 10 employs an actuator cam 4100 with multiple, separate, points of contact 4200 being used to act against one of the flanges 5100 on the movable insert 5000. Reducing the contact surface area between the actuator 4000 and the movable insert 5000 can help in reducing thermal transfer. However, in other embodiment the point of contact could be extended along the entire edge of the flange 5100. Many design options will be readily understood by a person skilled in the art.

Figure 11:
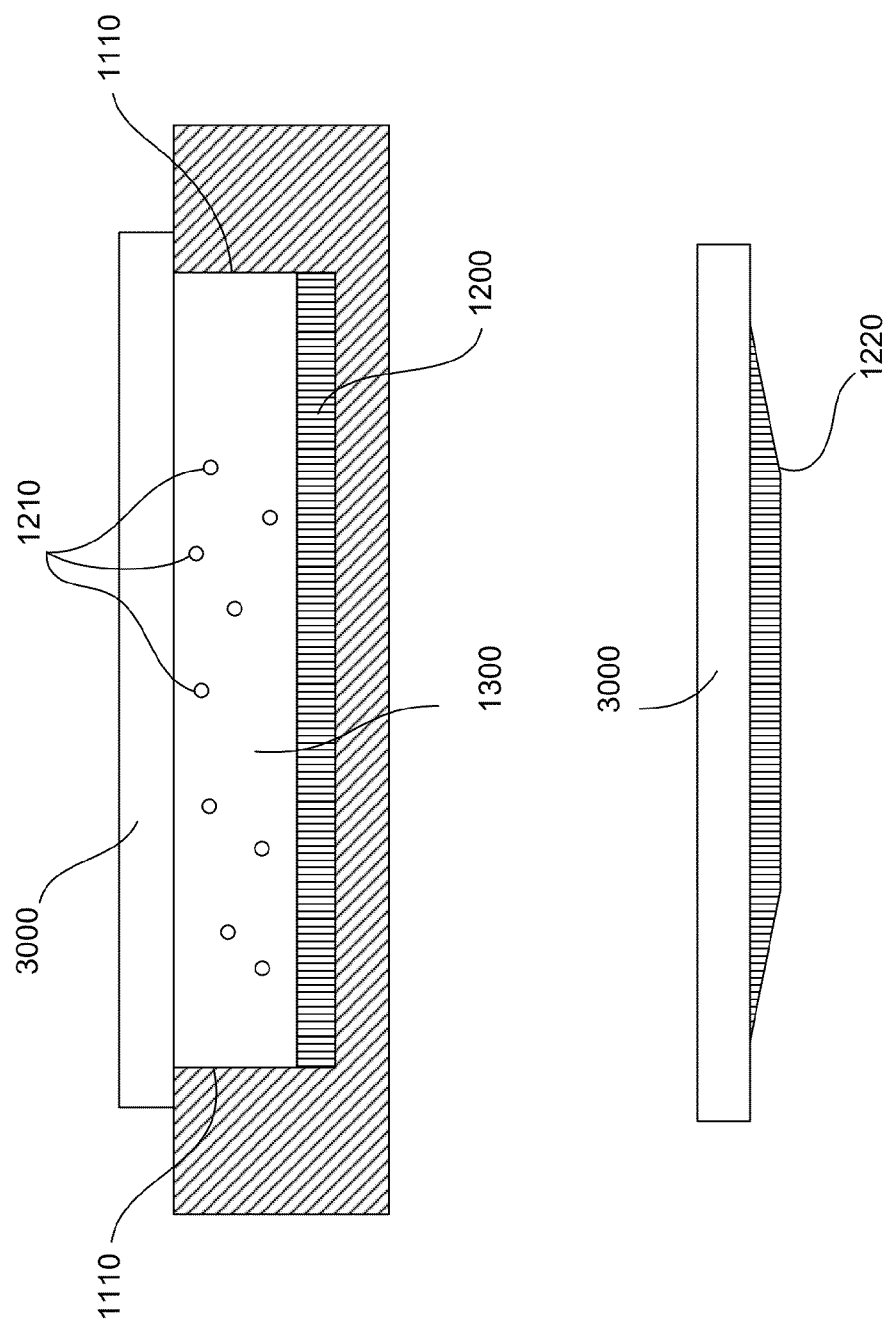
FIG. 11 illustrates a sectional view of a prior art evaporative deposition system and an exemplary profile of a thin film deposited by such a system.
Figure 12:
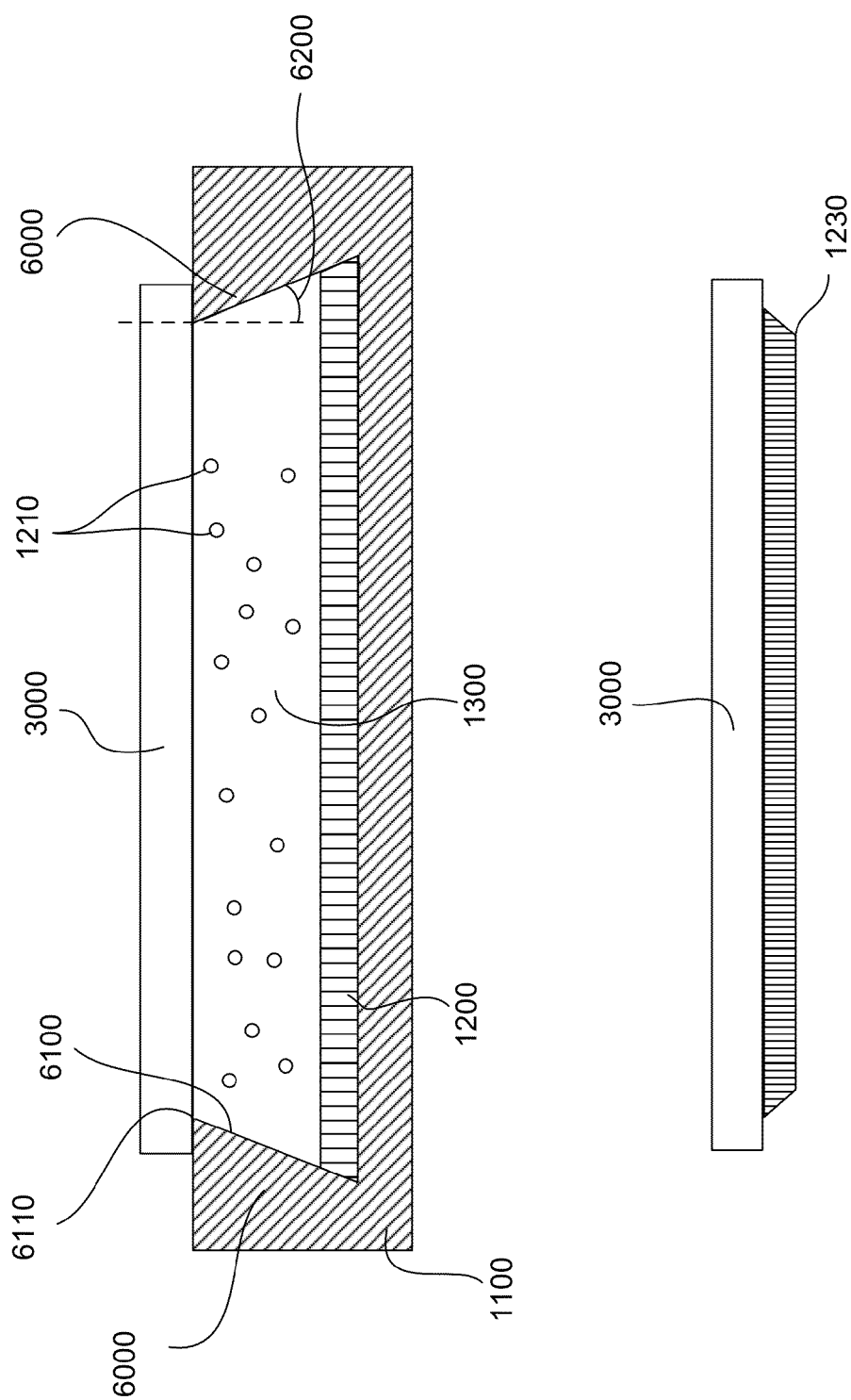
FIG. 12 illustrates a sectional view of an evaporative deposition system consistent with the present invention and an exemplary profile of a thin film deposited by such a system

Now referring to FIGS. 11 and 12 illustrated are exemplary thin films deposited in an evaporative deposition system 1000 with straight walls 1110 (FIG. 11) and an evaporative deposition system 1000 with an undercut perimeter mask 6000 (FIG. 12). In FIG. 11 the straight walls on the evaporative deposition system 1000 (a) radiate thermal energy on to the substrate 3000 heating the edges of the substrate 3000 near the walls; and (b) reflect off particles 1210 which impact the vertical side wall, adding energy to these particles 1210 and allowing the particles 1210 to reflect toward the substrate 3000. As a result, it less likely for a particle 1210 to deposit near the edges of the substrate 3000, and a greater number of particles are directed toward the center of the substrate resulting in a non-uniform thin film 1220. In FIG. 12, which illustrates an embodiment consistent with the present invention, the walls are undercut in order to both (a) reduce the thermal energy radiated from the walls onto the substrate 3000; and (b) redirect impinging particles back toward the bottom of the source 1100 (rather than allowing the particles 1210 to bounce toward the substrate 3000). This results in a more uniform thin film 1230.

As shown in FIG. 12, the undercut mask 6000 includes a mask surface 6100 which undercuts away from the substrate 3000. The mask surface 6100 includes a mask edge 6110 which is configured to be proximate to, up to an including touching, the surface of the substrate 3000. In FIG. 12 the mask edge 6110 is at the tip of a bezel formed by the mask surface 6100 and a portion of the undercut mask 6000 that contacts the substrate 3000. This is exemplary only. It should be understood that the mask edge 6110 need only be a portion of the mask surface 6100 which is proximate to the substrate 3000. Those of skill in the art will readily be aware for configurations consistent with the present invention.

Figure 13A:
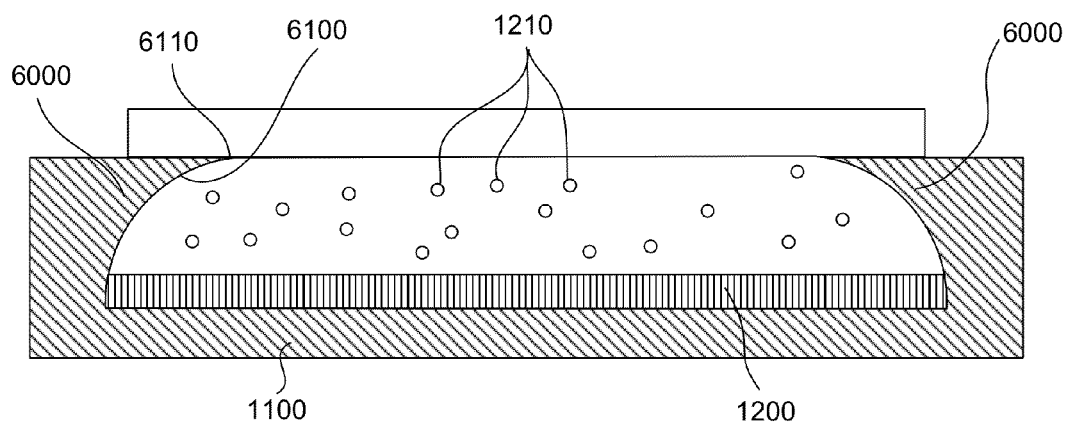
FIG. 13 illustrates exemplary undercut perimeter edge shapes that can be used consistent with the present invention.
Figure 13B:
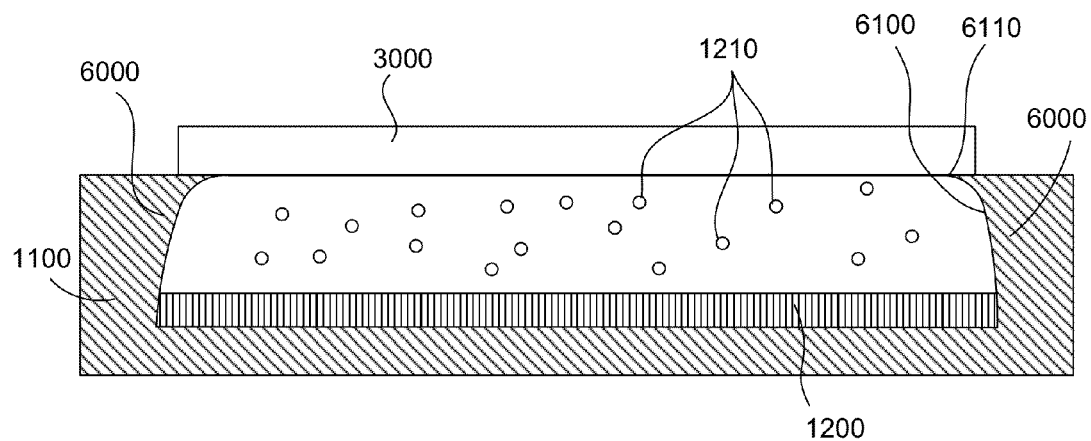
Figure 13C:
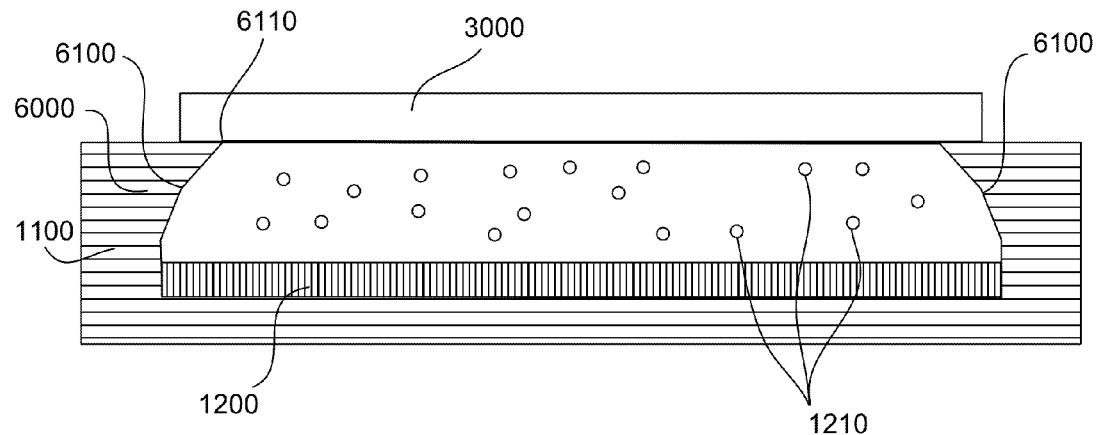
Figure 13D:
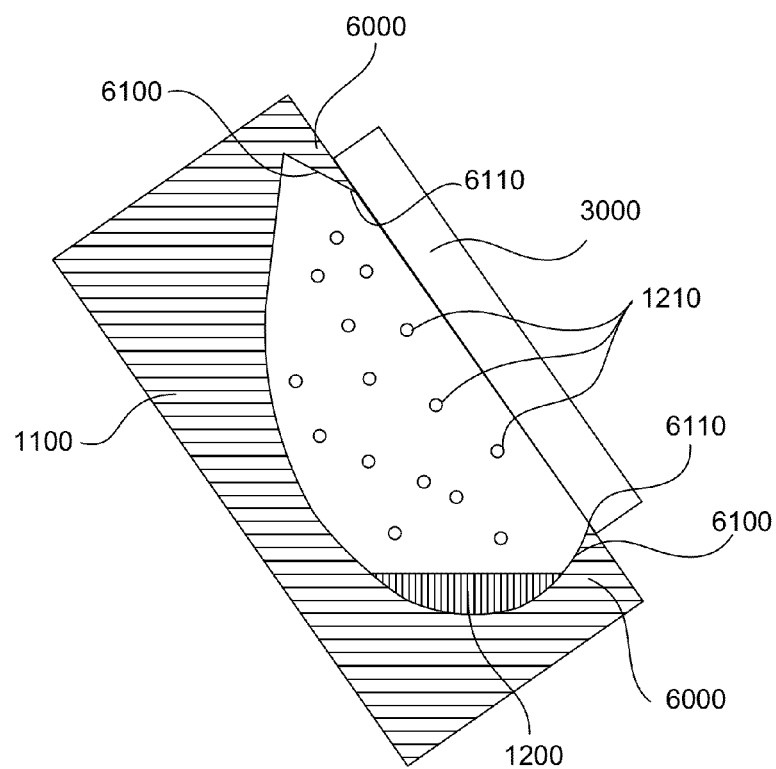

The undercut shape shown in FIG. 12 is exemplary only. Further examples of undercut shapes include curves (e.g., FIG. 13A and FIG. 13B), such as a parabolic curve (e.g., FIG. 13B), or straight-line arcs (e.g., FIG. 13C). Those of skill in the art will be readily aware of other shapes based on the present invention. Similarly, for FIG. 12 the angle 6200 of the undercut can be changed based on process factors, manufacturing issues, or other conditions. For example, exemplary angles 6200 could include angles between 15 degrees and 75 degrees, wherein the angle 6200 is measured between (a) a perpendicular vector to the deposition surface and (b) the surface of the undercut wall. It is further notable that the shape of the undercut in an undercut mask 6000 does not need to be uniform. For example, for a vertical or slanted application of an undercut mask the undercut shape near the top of the mask 6000 may be different than the undercut shape near the bottom of the mask. FIG. 13D shows a slanted embodiment of an undercut mask 6000 wherein the upper portion of the mask 6000 comprises a different shape than the lower portion 6000.

Figure 14:
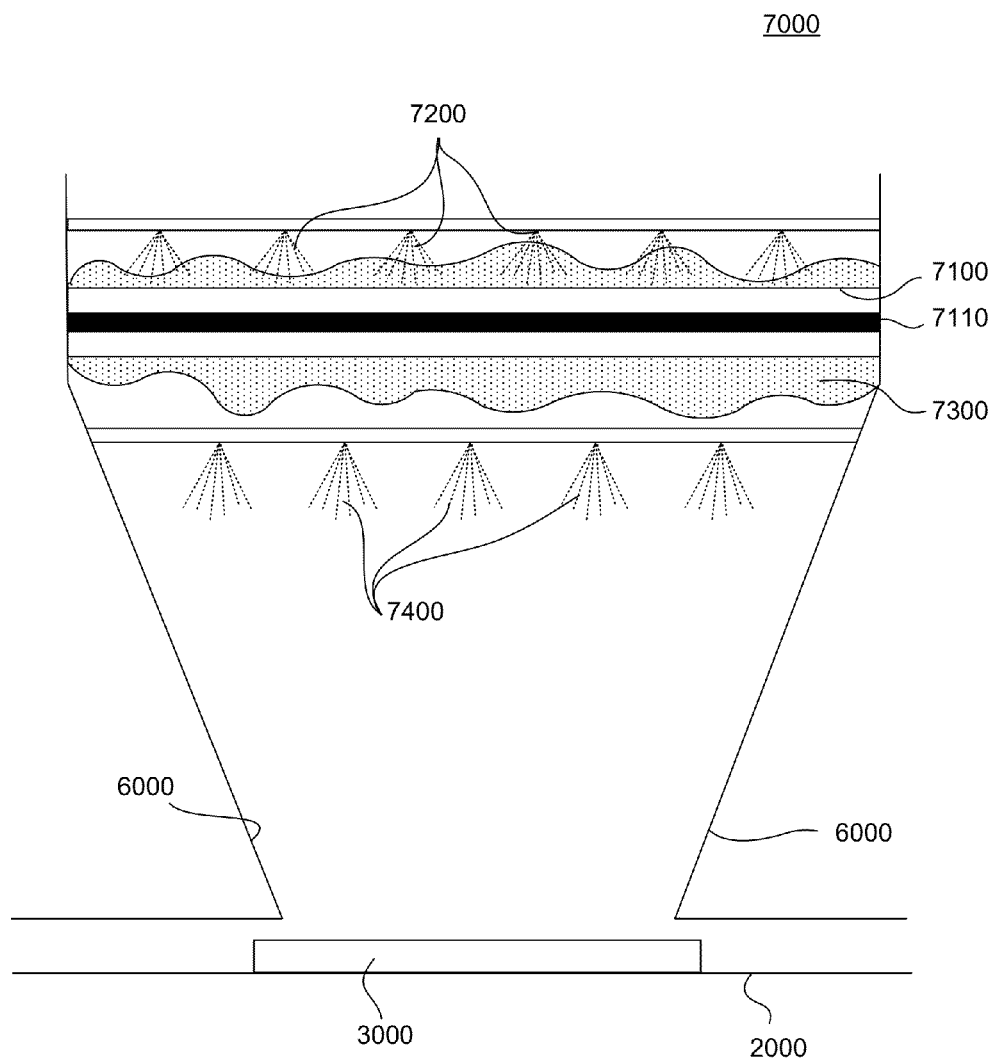
FIG. 14 illustrates a PECVD deposition system with an undercut perimeter edge consistent with the present invention.

Use of an undercut perimeter mask is not limited to an evaporative deposition system. An undercut perimeter mask may provide benefits for other types of thin film deposition systems, such as PECVD systems or sputtering systems. FIG. 14 shows a sectional view of an undercut perimeter mask 6000 for use in a PECVD system 7000. In this embodiment, the undercut perimeter mask 6000 is configured to be proximate to a substrate 3000. The substrate 3000 may be on a substrate transport system 2000, such as a track system, or on a substrate stand (e.g., see substrate stand 2200 in FIG. 15). In some embodiments it may be preferential for the undercut perimeter mask 6000 to be lowered, or the substrate 3000 raised, in order to create a seal between the undercut mask 6000 and the substrate 3000. In application, the undercut mask 6000 will be disposed within a vacuum chamber (not shown). In some applications, the undercut perimeter mask 6000 can be integrated with the walls of the vacuum chamber.

For the PECVD system 7000 in FIG. 14, a linear discharge tube 7100, including inner conductor 7110, is configured to provide sufficient power to ignite a support gas 7200 to form a plasma 7300. The plasma 7300 then provides radicals which disassociate feedstock gas(es) 7400 into new deposition material which then deposits on the substrate 3000. A waste gas removal system (now shown) can be integrated into the undercut perimeter mask or separately configured. By partially surrounding the linear discharge tube 7100 and feedstock gas 7400 the present invention can increase material use efficiency, reduce deposition on other surfaces inside the vacuum chamber (reducing off-time for cleaning) and achieve more uniform surfaces.

In order to prevent deposition on the surfaces of the undercut perimeter mask 6000, the mask may be configured to operate at an elevated temperature. For example, in one embodiment a mask 6000 can be configured with a heating element (not shown) that provides sufficient heat to the surfaces of the mask 6000 to reduce or prevent deposition on those surfaces. Based on the elevated temperature of the mask 6000, the mask may include an insulator (not shown) which is positioned to contact the surface of the substrate 3000—protecting the substrate from contact heating.

Figure 15:
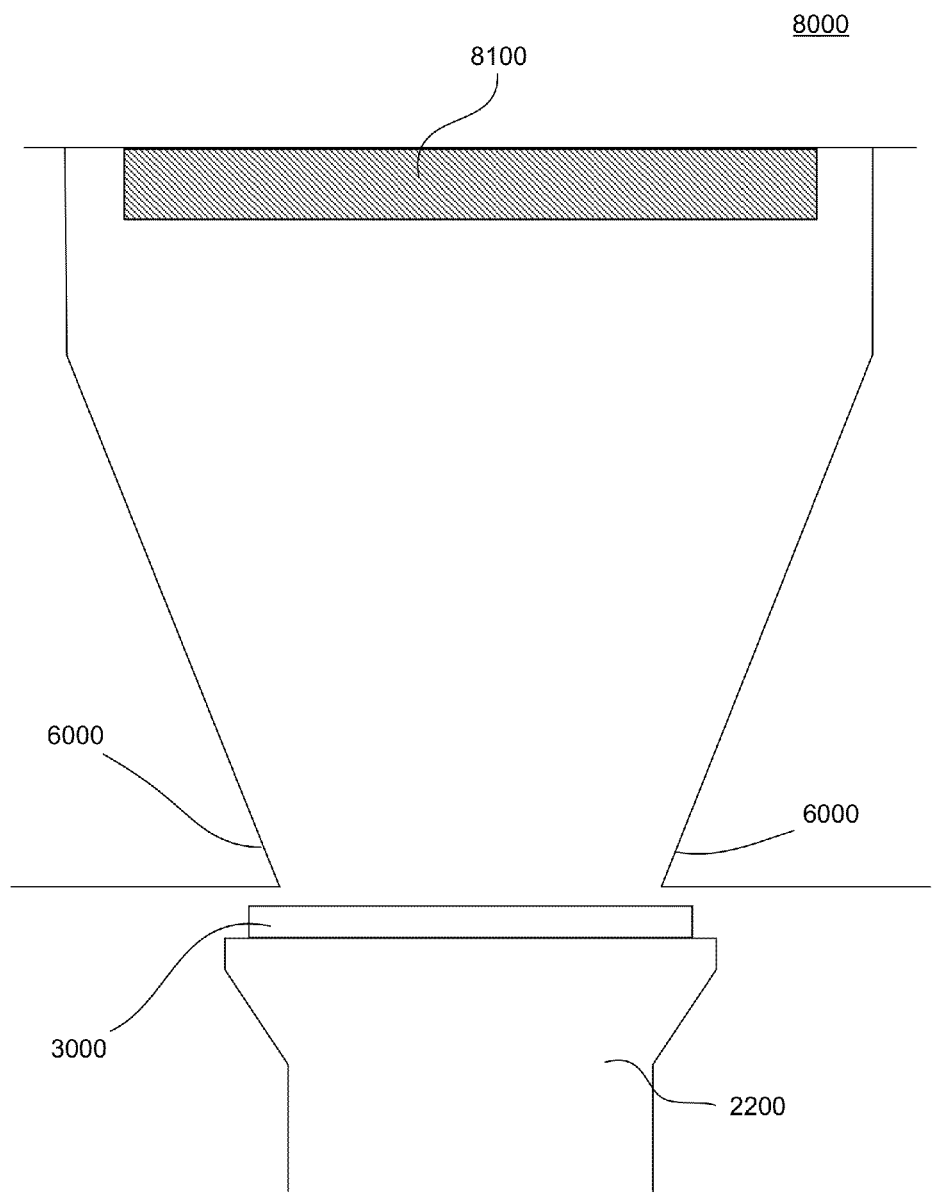
FIG. 15 illustrates a sputtering deposition system with an undercut perimeter edge consistent with the present invention.

In another embodiment, the undercut perimeter mask 6000 can be used within a sputter deposition system 8000. FIG. 15 shows an embodiment of the present invention where an undercut perimeter mask 6000 is used with a planar magnetron 8100, including planar cathode and planar target. Those of skill in the art will understand modifications that may be made for other sputtering systems such as a rotatable magnetron system. In FIG. 15 the sputtering deposition system 8000 includes a substrate stand 2200 which is configured to raise or lower a substrate 3000 such that the substrate is proximate to, up to and including touching, the undercut perimeter mask 6000. This allows for a seal between the substrate 3000 and the undercut perimeter mask 6000. As discussed above, the undercut perimeter mask 6000 can be configured to operate at an elevated temperature. Accordingly, in some embodiments an insulator (not shown) may be included to reduce contact heating between the undercut perimeter mask 6000 and the substrate 3000.

It should be further noted that the shape of the mask 6000, as it contacts the substrate 3000, can vary based on application. While the figures above show sectional views, this sectional view could be the side view of a rectangular undercut perimeter mask, a circular undercut perimeter mask, an oval undercut perimeter mask, etc. Those of skill in the art will be readily aware of different shapes and configurations consistent with the present disclosure.

Figure 16:
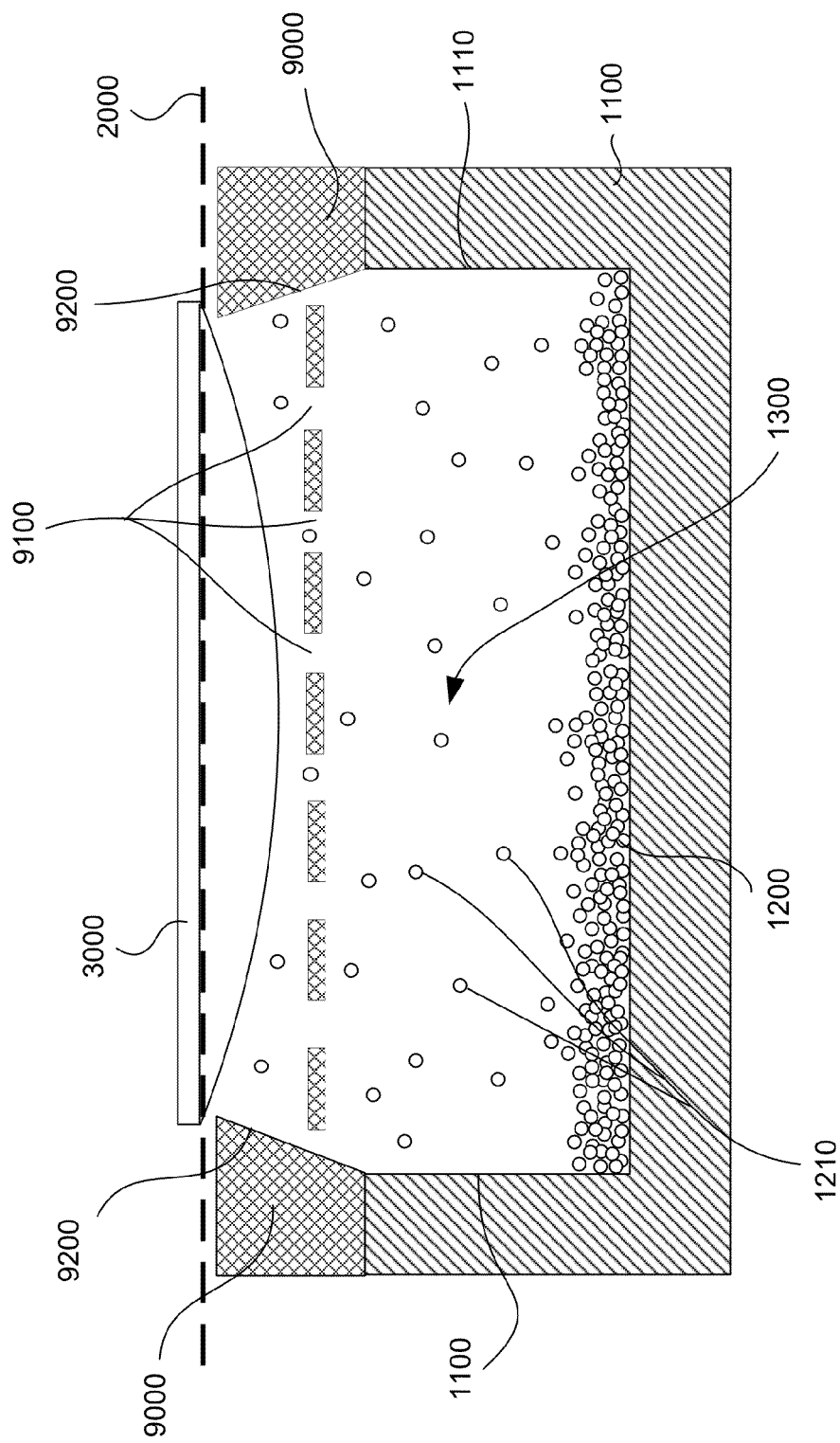
FIG. 16 illustrates an embodiment of an evaporative deposition system consistent with the present invention which includes a vapor diffuser.

It is also noted that the undercut perimeter mask 6000 can be incorporated and combined with other design features. For example, referring now to FIG. 16 it shows an embodiment of the present invention which further includes a vapor diffuser 9000. The vapor diffuser 9000 includes at least one aperture 9100, and here multiple apertures 9100, configured to allow particles 1210, or vapor 1210, to move from the vapor pocket 1300 and deposit on the substrate 3000. Those of skill in the art will recognize that the apertures 9100 can be evenly spaced and sized, or the spacing and size of the apertures 9100 may differ depending on the position of each aperture in order to promote more uniform deposition. Moreover, in some embodiments the aperture(s) 9100 size and position may be fixed or it may be variably controlled. In FIG. 16 the internal wall 9200 of the vapor diffuser 9000 is undercut in order to promote improved thin film deposition. While not shown in FIG. 16, it is further notable that this embodiment could be modified to further include a movable insert 5000.

Nothing in the present description should suggest that a movable insert 5000 is limited to linear motion, or vertical or horizontal motion in order to movably seal the vapor pocket. In some embodiments, the movable insert 5000 may be designed to follow an angled path, an arced path, or some other path in order to form a seal. For example, if a movable insert 5000 were added to the system shown in FIG. 16, it may be designed to move at an angle substantially parallel to the undercut wall 9200 of the vapor diffuser. Similarly, for other systems using an undercut perimeter mask 6000 the shape and motion of the movable insert 5000 may vary to best fit the configuration of the mask 6000 and other design constraints. The present disclosure is exemplary and those of skill in the art will be aware of many design options consistent with the present invention.

Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications, and alternative constructions fall within the scope and spirit of the disclosed invention as expressed in the claims.

What is claimed is:

1. A system for coating a substrate, the system comprising:
a deposition chamber;
a vapor pocket located within the deposition chamber; and
an at least one movable seal, wherein the at least one movable seal is configured to form a first seal with a first portion of a substrate, and wherein the first seal is configured to prevent a vapor from leaking past the first portion of the substrate out of the vapor pocket wherein the at least one movable seal comprises a first flange, wherein the first flange forms a wall of the vapor pocket; and a second flange, wherein the second flange is configured to be movably disposed within a first groove of the source block.

2. The system of claim 1, wherein the at least one movable seal is a first movable seal, the system further comprising:
a second movable seal, wherein the second movable seal is configured to form a second seal with a second portion of the substrate, and wherein the second seal is configured to prevent the vapor from leaking past the second portion of the substrate out of the vapor pocket.

3. The system of claim 1, further comprising a source block, wherein the source block provides heat to generate the vapor for the vapor pocket, and wherein the at least one movable seal is thermally connected to the source block.

4. The system of claim 1, wherein the at least one movable seal further comprises:
a third flange, wherein the third flange is configured to be movably disposed within a second groove of the source block.

5. The system of claim 1, wherein the first flange forms an undercut wall of the vapor pocket.

6. The system of claim 1, wherein the second flange and the first groove are configured to guide movement of the at least one movable seal.

7. The system of claim 1 further comprising an actuator for moving the at least one movable seal.

8. The system of claim 7, wherein the actuator is a rotatable cam, and wherein the rotatable cam contacts an end of the second flange.

9. The system of claim 1, wherein the at least one movable seal comprises a first material, wherein the first material is configured to promote heat transfer between the at least one movable seal and the source block.

10. The system of claim 1, wherein the at least one movable seal comprises a material selected from the group consisting of graphite, extruded graphite, isomolded graphite, titanium, and tungsten.

11. The system of claim 1, wherein the at least one movable seal is shaped to match a shape of the first portion of the substrate.

12. The system of claim 11, wherein the at least one movable seal is shaped to match a curvature of the first portion of the substrate based on the process conditions.

* * * * *